March 17, 1964    L. P. VITT ET AL    3,125,686

DELAY CIRCUIT

Filed March 29, 1960

WITNESSES

Leon J. Taza

James F. Young

INVENTORS

Leonard P. Vitt and

Frank J. Prines

BY Ernest P. Klipfel

ATTORNEY

United States Patent Office 3,125,686

Patented Mar. 17, 1964

3,125,686
DELAY CIRCUIT

Leonard P. Vitt, Pittsburgh, and Frank J. Prines, Penn Hills Township, Allegheny County, Pa., assignors to Westinghouse Electric Corporation, East Pittsburgh, Pa., a corporation of Pennsylvania Filed Mar. 29, 1960, Ser. No. 18,350
5 Claims. (Cl. 307—88)

The present invention relates generally to control circuitry and more particularly to control circuitry for a delay-on-input logic function.

Accordingly, an object of the present invention is to provide improved control circuitry for performing a delay-on-input logic function.

Another object of the present invention is to provide control circuitry having an improved time delay through an increased capacitance to delay ratio.

Another object of the present invention is to provide control circuitry for a delay-on-input logic function wherein the circuitry may be operated by and responsive to a relay contact, another static control circuit, or a radiation sensitive source.

Another object of the present invention is to provide control circuitry for a delay-on-input logic function wherein rapid resetting upon removal of the input is accomplished.

Further objects and advantages of the present invention will be readily apparent from the following detailed description taken in conjunction with the drawing in which.

Figures 1, 2, 3:
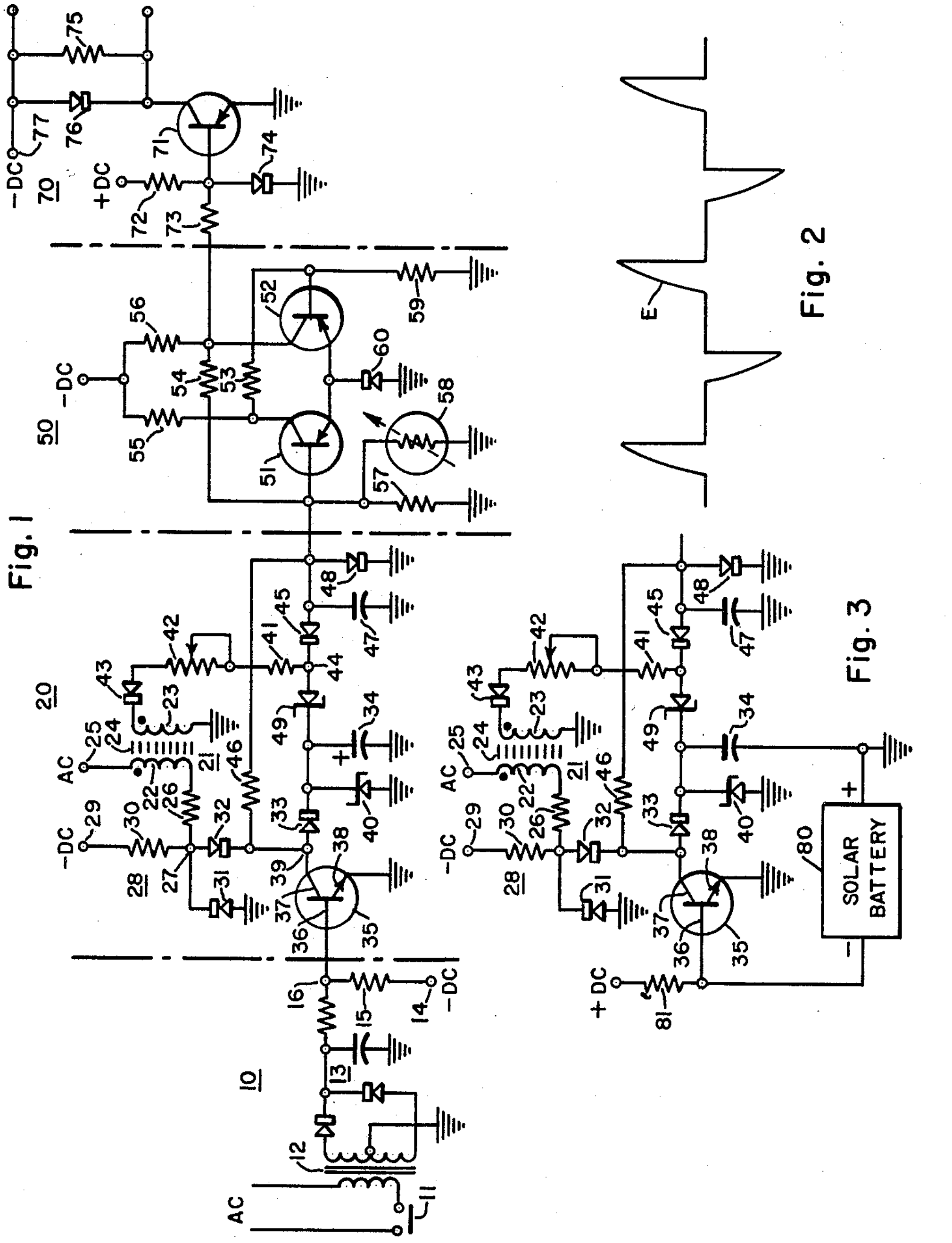
FIGURE 1 is an electrical schematic diagram of an illustrative embodiment of the invention.
FIG. 2 is a graphical representation of the wave form at a selected portion of FIG. 1; and, FIG. 3 is an electrical schematic diagram of an alternate embodiment of a portion of the circuitry illustrated in FIG. 1.

Referring to FIG. 1, the invention generally comprises an input portion 10, a delay portion 20, a flip-flop portion 50 and an output portion 70. The circuitry illustrated in FIG. 1 provides a "delay-on-input" logic function in that upon receipt of a signal by the input portion 10, the delay portion 20 initiates a time delay. Upon expiration of the preselected delay time, the flip-flop portion 50 changes output states with the output portion 70 providing an amplified output signal in response to the flip-flop portion 50. The flip-flop portion 50 does not change output states until the expiration of a predetermined delay time after receipt of an input signal at the input portion 10.

The input portion 10 provides a signal to the delay portion 20 upon the closing of a normally open contact 11 which connects an alternating current source across the primary winding of a transformer 12. The secondary winding of the transformer 12 is center-tapped to ground. The end terminals of the secondary winding are connected to a rectifying and filtering circuit 13 to provide a direct current potential, herein illustrated to be a positive polarity, which direct current potential is of sufficient magnitude to block a negative direct current bias potential at terminal 14 applied through the resistor 15 at the junction 16.

The delay portion 20 comprises a saturable reactor 21 having a primary winding 22 and a secondary winding 23 inductively disposed on a saturable core 24. An end terminal 25 of the primary winding 22 is adapted to be connected to an alternating current supply voltage source while the opposite end of the primary winding 22 is connected through a resistive element 26 to the junction 27. A non-linear device 28 comprising a series circuit, including a source 29 of negative direct current potential, an impedance member 30 and a rectifier 31 so poled with respect to the source 29 that the rectifier 31 acts as a low impedance when the saturable reactor 21 is being driven to positive saturation and acts as a relatively high impedance once the saturable core 24 has been driven to positive saturation.

When the saturable core 24 is driven to positive saturation during positive half cycles of the alternating current supply voltage at terminal 25, current flow is allowed through a rectifier 32, junction 39 and through a rectifier 33 to energy storage means illustrated as a capacitor 34 which is grounded at its opposite side.

It can be seen that the rectifier 33 isolates the capacitor 34 so that the capacitor retains its charge independently of the changes in polarity of the alternating current supply voltage. A Zener diode 40 having a breakdown voltage selected to establish a predetermined level of charge on the capacitor 34 is connected across the capacitor 34. The purpose of the Zener diode is to assure a constant level of charge on the capacitor 34 at the beginning of each timing cycle under normal variations in supply voltage.

The saturable reactor 21 may be of any suitable type such as a toroidal reactor and is wound so that the core 24 will saturate at a predetermined phase angle of the alternating current supply voltage. Where desirable the core can be made to saturate at different phase angles for each polarity of the supply voltage. The saturable reactor 21 is wound to step up the primary voltage so that a wave form with a peak value greater than the primary voltage will appear on the secondary winding 23. With the saturable reactor wound to saturate at a phase angle of approximately 45° of the supply alternating current signal, the voltage induced in the secondary winding 23 is as illustrated by the wave form E shown in FIG. 2. The voltage, E, is induced in the secondary winding 23 of the saturable reactor 21 during that portion of each half cycle of the alternating current supply voltage source when the core 24 is unsaturated.

The capacitor 34 is connected to discharge through a series circuit comprising another Zener diode 49, junction 44, a resistor 41, variable resistor 42 and a unilateral conduction means, herein shown as a rectifier 43 connected to one end of the secondary winding 23. The opposite end of the secondary winding 23 is grounded. Therefore, the capacitor 34 is adapted to be charged through the saturable reactor 21 when the alternating current supply voltage at the terminal 25 is of positive polarity and adapted to discharge through the saturable reactor means when the supply voltage is of a negative polarity.

A semiconductor device 35 having a base electrode 36, a collector electrode 37 and an emitter electrode 38 is utilized in a switching mode across the junction 39 to ground. The semiconductive device 35 is illustrated to be a transistor of the N-P-N type. That is, the transistor 35 will be conductive upon an appropriate signal of positive polarity to the base electrode 36 and will be cutoff upon receipt of an appropriate negative signal.

The flip-flop section 50 comprises transistors 51 and 52, illustrated to be of the PNP type, with cross connected inputs and outputs through resistors 53 and 54, respectively. Negative direct current voltage is applied to the collector of each transistor through resistors 55 and 56, respectively. The emitter electrodes of the transistors 51 and 52 are commonly connected to ground through a rectifier 60. The base electrode of each transistor 51 and 52 is connected to ground through resistors 57 and 59, respectively. A thermistor element 58 connected in shunt with the resistor 57 varies its impedance with temperature to compensate for temperature variation in the characteristics of the flip-flop section 50. Of course, any suitable temperature compensating network may be used for the entire circuit including capacitors and flip-flop circuits. The base electrode of the transistor 51 is also connected to the junction 44 between the Zener diode 49 and resistor 41 by means of the rectifier 45. A resistor 46 connects the base electrode of the transistor 51 to receive the positive pulses of the alternating current supply voltage thereby cutting off the transistor 51. A capacitor 47 connecting the base electrode of the transistor 51 to ground ensures that the flip-flop section 50 will always be initially energized in the proper state. The capacitor 47 initially shunts all base drive from the transistor 51. The rectifier 48 provides means for discharging the capacitor 47 and prevents excessive bias voltage on transistor 51. To further ensure the flip-flop section 50 being initially biased to the proper state, the resistors 53 and 55 are chosen to present a lower resistance than resistors 54 and 56, thereby providing more base drive for the transistor 52 than for transistor 51 when power is initially turned on. Furthermore, if the control relay 11 is open when the circuit is initially energized, the reset signal provided through the resistor 46 to the base electrode of the transistor 51 will ensure that the transistor 51 is cut off simulating a switch in the open position. The diode 60 ensures a constant voltage drop from emitter to ground regardless of which transistor is conducting and the resultant amount of current through the diode. When transistor 52 is conducting, resistors 54 and 57 form a voltage dividing network. Their values are so chosen that the voltage from the base of transistor 51 to ground is less negative than the voltage across the common emitters to ground. This makes the base of transistor 51 positive with respect to its emitter and thus provides positive bias to transistor 51. When transistor 51 is conducting, resistors 53 and 58 and diode 60 provide positive bias for transistor 52 in the same manner. The use of diode 60 therefore is a means for obtaining constant bias voltages for transistors 51 and 52 even though the supply voltage may vary within reasonable limits. While the transistors 51 and 52 of the flip-flop section 50 have been illustrated to be of the P-N-P type, it is to be understood that transistors of the N-P-N type may be utilized with suitable changes of polarity in the circuit.

The output section 70 comprises a transistor 71 connected in a switching mode with its base electrode positively biased through the resistor 72. A current limiting resistor 73 connects the base electrode of the transistor 71 to the collector electrode of the transistor 52. A rectifier 74 provides means for keeping a constant positive bias on transistor 71 since the forward or conducting voltage drop across a diode is constant over a wide range of forward conducting currents. The rectifier 74 also prevents excessive bias voltage on transistor 71 and prevents the positive direct current voltage applied to resistor 72 from interfering with the bias set up for transistor 51.

The transistor 71 is shown to be of the P-N-P type and is biased to cutoff by the positive direct current potential through the resistor 72 thereby allowing no current to flow through the load resistor 75. The emitter electrode of the transistor 71 is grounded while the collector electrode is connected through a load resistor 75 to terminal 77 which is adapted to be connected to a negative direct current bias supply. A commutating rectifier 76 is connected in parallel with the load resistor 75 should an inductive load such as a relay be put in place of or in parallel with the load resistor 75.

In operation, when the relay contact 11 is open, the base electrode of the transistor 35 is negatively biased and hence the transistor 35 is cut off simulating a switch in the open position. The capacitor 34 is allowed to charge through the primary winding 22 of the saturable reactor 21 to a predetermined value determined by the Zener diode 40. At this time, the transistor 51 is also cut off because of the positive signal provided through the resistor 46 to its base electrode. Thus, transistor 52 is saturated simulating a switch in the closed position removing the negative direct current bias applied to the resistor 73. Hence the transistor 71 is cut off allowing no current to flow in the load 75.

When the relay contact 11 closes, the base electrode of the transistor 35 becomes positive so the transistor 35 saturates, simulating a switch in the closed position. This, in effect, ties the charging voltage of the capacitor 34 to ground. The capacitor 34 has only one discharge path to ground however which is through the Zener diode 49, the resistor 41, the adjustable resistor 42 and the secondary winding 23. The rectifier 43 is poled to allow such discharge. The saturable reactor 21 has a chopped wave form output, E, on its secondary winding 23 as shown in FIG. 2. When the chopped wave form is positive, the capacitor 34 is blocked from discharge through the adjustable resistor 42. When the voltage, E, across the secondary winding 23 is zero, the capacitor 34 discharges at a comparatively slow rate because of the high impedance value selected of the adjustable resistor 42 and resistor 41. However, during the negative half cycle of the secondary voltage, the potential difference across the adjustable resistor 42 and resistor 41 is substantial. Therefore, the capacitor 34 discharges at a rapid rate for the short period of time when the wave form across the secondary winding of the saturable reactor 21 is of negative polarity. The rate of discharge is functionally related to the magnitude of the secondary voltage and the time duration of the negative pulses which, in turn, are directly related to the phase angle at which the saturable reactor will saturate. The rectifier 43 blocks the positive portion of the secondary voltage so that the capacitor 34 sees only the negative spike every cycle of the supply voltage. The negative pulses of voltage across the secondary winding 23 are amplified by the saturable reactor 21 to be of sufficient magnitude to trigger the transistor 51 in the flip-flop section 50 to saturation and would so do if these negative pulses were not blocked by the positive charge on the capacitor 34.

After a predetermined discharge time, the capacitor 34 will have discharged sufficiently to be unable to block the negative pulses across the secondary winding 23 and a negative pulse of sufficient magnitude will provide base drive of the transistor 51 switching the flip-flop section 50 to its alternate output state. The transistor 71 in the output circuit 70 responds to the cut off state of the transistor 52 and is saturated thereby with a resultant current flow through the load resistor 75.

Upon opening of the relay contact 11, the circuit rapidly resets by recharging the capacitor 34 as the positive half cycles of the supply voltage on the primary winding 22 traverse resistor 26 and rectifiers 32 and 33. Thus, it is readily apparent that the present invention provides an improved capacitance to delay ratio by discharging the capacitor 34 through a saturable reactor 21. The delay time may be adjusted by varying the adjustable resistor 42 and further by adapting the saturable core 24 to saturate at any desired phase angle of the supply voltage or increasing the amplification of the voltage across the saturable reactor.

It is to be noted that the circuitry shown in FIG. 1 may be utilized to operate in response to an input from a static control device by providing a positive bias supply to the base electrode of the transistor 35 in place of the negative bias 14 and merely tying the static device common to the negative direct current bias indicated at terminal 77 if a positive going signal is to be available for the static control device. When the circuitry shown in FIG. 1 is being operated in response to a static device, instead of the relay contact input illustrated, the base electrode of the transistor 35 is normally cut off because of the negative signal provided from the static circuit common. When the static circuit input device gates an output, the base electrode of the transistor 35 becomes positive. If this half cycle coincides with the half cycle signal which charges the capacitor 34 through the saturable reactor 21 the transistor 35 will saturate during this time and allow the capacitor 34 to discharge as explained previously.

FIG. 3 illustrates an alternate embodiment of the input section and delay sections shown in FIG. 1. Like components have been given identical reference characters. A solar battery 80, of polarity as indicated, is connected across the base electrode of the transistor 35 to ground. The transistor 35 is positively biased through resistor 81 causing saturation of the transistor 35. However, when radiation impinges on the solar battery 80, the battery generates a voltage causing the base electrode of the transistor 35 to be of negative potential, thus blocking the positive bias provided by the resistor 81 and holding the transistor 35 at cutoff. When the radiation is blocked from the solar battery 80, the generated voltage ceases and the transistor 35 becomes saturated because of the positive bias signal provided through the resistor 81. The transistor 35 then simulates a switch in the closed position and the delay section 20 times out in the manner hereinbefore described.

Thus, it is readily apparent that the present invention has provided circuitry for increasing the delay time for a given capacitor and a given amount of charge thereon. The circuitry performs a "delay-on-input" logic function which can be operated by a relay contact, static control inputs or a radiation sensitive or photosensitive power source. By suitable changes in transistor types, reversing diodes, and polarity of bias voltages, the circuitry shown may perform a delay-off-input logic function. The range of delay times can be additionally varied by changing the capacity of the storage capacitor, adjusting the resistance of the adjustable resistor 42, varying the phase angle of the power supply at which saturation of the saturable core will occur, or changing the voltage amplification across the saturable reactor. Additionally, the circuitry rapidly resets upon removal of the input signal.

For purposes of illustration, the present invention has been described with a degree of particularity, but it is to be understood that all equivalents, alterations and modifications within the spirit and scope of the invention are herein meant to be included.

We claim as our invention:

1. In a timing circuit, in combination; saturable reactor means including a saturable core; means for energizing said saturable reactor means with a supply voltage to saturate said core at a predetermined phase angle of the supply voltage; capacitive means connected to be charged through said saturable reactor means when the supply voltage is of a predetermined polarity and to discharge through said saturable reactor means when the supply voltage is of opposite polarity; input means for removing the charging voltage from said capacitive means in response to an input signal; adjustable resistance means connected in circuit relation with said reactor means and said capacitive means for varying the discharge rate of the capacitive means, and output means for providing an output upon discharge of said capacitive means below a predetermined magnitude of stored energy.

2. In a timing circuit, in combination; saturable reactor means including a saturable core having a primary winding and a secondary winding inductively disposed thereon; means for energizing said primary winding with a supply voltage to saturate said core at a predetermined phase angle of the supply voltage; capactive means; first unidirectional circuit means connecting said primary winding to said capacitive means for allowing current flow to said capacitive means when the supply voltage is of a predetermined polarity; second unidirectional circuit means connecting said capacitive means to said secondary winding and poled to allow current flow from said capacitive means to said secondary winding only; said capacitive means being connected to be charged through said primary winding when the supply voltage is of said predetermined polarity and to discharge through said secondary winding when the supply voltage is of opposite polarity; input means for grounding the charging voltage in response to an input signal; said capacitive means discharging through said secondary winding to ground when the core is saturated and further discharging during that portion of each half cycle of said opposite polarity of the supply voltage when the core is unsaturated.

3. In a timing circuit, in combination; saturable reactor means including a saturable core having a primary winding and a secondary winding inductively disposed thereon; means for energizing said primary winding with a supply voltage to saturate said core at a predetermined phase angle of the supply voltage; capacitive means; first unidirectional circuit means connecting said primary winding to said capacitive means for allowing current flow to said capacitive means when the supply voltage is of a predetermined polarity; second unidirectional circuit means connecting said capacitive means to said secondary winding and pole to allow current flow from said capacitive means to said secondary winding only; said capacitive means being connected to be charged through said primary winding when the supply voltage is of said predetermined polarity and to discharge through said secondary winding when the supply voltage is of opposite polarity; variable resistance means connected in circuit relationship with said secondary winding and said capacitive means for varying the discharge rate of said capacitive means; said capacitive means discharging through said secondary winding to ground when the core is saturated and further discharging during that portion of each half cycle of said opposite polarity of the supply voltage when the core is unsaturated.

4. In a timing circuit, in combination; saturable reactor means including a saturable core having a primary winding and a secondary winding inductively disposed thereon; means for energizing said primary winding with a supply voltage to saturate said core at a predetermined phase angle of the supply voltage; said saturable reactor means amplifying the supply voltage appearing across said primary winding so that the voltage appearing across said secondary winding is of greater magnitude; capacitive means; first unidirectional circuit means connecting said primary winding to said capacitive means for allowing current flow to said capacitive means when the supply voltage is of a predetermined polarity; second unidirectional circuit means connecting said capacitive means to said secondary winding and pole to allow current flow from said capacitive means to said secondary winding only; said capacitive means being connected to be charged through said primary winding when the supply voltage is of said predetermined polarity and to discharge through said secondary winding when the supply voltage is of opposite polarity; variable resistance means connected in circuit relationship with said secondary winding and said capacitive means for varying the discharge rate of said capacitive means; input means for grounding the charging voltage in response to an input signal.

5. Electrical circuitry for performing a delay-on-input logic function comprising: delay means; flip-flop means having an output dependent on the last of a plurality of inputs supplied to the flip-flop means; said delay means comprising a saturable reactor means, capacitive means for storing energy connected in circuit relationship with said saturable reactor means, means for energizing said saturable reactor means with a supply voltage, said capacitive means adapted to be charged through said saturable reactor means when the supply voltage is of a predetermined polarity and adapted to discharge through said saturable reactor means when the supply voltage is of opposite polarity; said flip-flop means connected to receive a first input from said saturable reactor means during each half cycle of said opposite polarity of the supply voltage when the saturable reactor means is unsaturated; said flip-flop means connected to receive a second input from said saturable reactor means when the supply voltage is of said predetermined polarity; transistor switching means for blocking said second input to said flip-flop means in response to a control signal, the charge on said capacitive means blocking said first signal to said flip-flop means until the capacitive means has discharged below a predetermined level; and output means operably connected to said flip-flop means for providing an output in response to said first input to said flip-flop means.

References Cited in the file of this patent

UNITED STATES PATENTS

| | | |
|---|---|---|
| 2,713,674 | Schmitt | July 19, 1955 |
| 2,849,624 | Snyder | Aug. 26, 1958 |
| 2,912,602 | Bownik | Nov. 10, 1959 |
| 2,920,213 | Elias | Jan. 5, 1960 |
| 2,970,272 | Large | Jan. 31, 1961 |
| 2,976,518 | Eckert | Mar. 21, 1961 |
| 2,997,694 | Thompson | Aug. 22, 1961 |